United States Patent [19]

Hendren et al.

[11] Patent Number: 4,886,578

[45] Date of Patent: Dec. 12, 1989

[54] HIGH HEAT RESISTANT OIL-IMPREGNATABLE ELECTRICAL INSULATING BOARD

[75] Inventors: Gary L. Hendren, Richmond, Va.; Richard L. Provost, Kennett Square, Pa.; Kim L. Fried, East Burke; Leland A. Taylor, Lyndon, both of Vt.

[73] Assignee: E. I. Du Pont De Nemours and Company, Wilmington, Del.

[21] Appl. No.: 238,441

[22] Filed: Aug. 30, 1988

Related U.S. Application Data

[63] Continuation-in-part of Ser. No. 100,738, Sep. 24, 1987, abandoned.

[51] Int. Cl.$^4$ .......................... D21H 1/02; D21H 5/12
[52] U.S. Cl. .................................... 162/123; 162/138; 162/146
[58] Field of Search ....................... 162/138, 146, 123; 174/121 SR, 122 R, 124 R, 137 B

[56] References Cited

U.S. PATENT DOCUMENTS 3,756,908  9/1973  Gross ................................... 162/146
4,595,457  6/1986  Nishiyama et al. ................. 162/123

OTHER PUBLICATIONS

"Advanced Concepts for Transformers Mechanical Strength", published Sep. 1981.
"Advanced Concepts for Transformers Pressboard Dielectric Constant and Mechanical Strength", Dept. of Energy Report, (Mar. 1982).
"Insulation System and Thermal Evaluation of Transformers Using High Thermal—Resistance Insulating Materials", Isole, Hitachi, Rev., vol. 26, (1977).

Primary Examiner—Peter Chin

[57] ABSTRACT

A process for making a high heat resistant oil-impregnatable insulating board, having a dielectric constant less than 2.7, made from bleached polytetrafluoroethylene floc and aromatic polyamide fibrids and the resulting insulating board are disclosed.

8 Claims, No Drawings ize: 4,886,578

HIGH HEAT RESISTANT OIL-IMPREGNATABLE ELECTRICAL INSULATING BOARD

This application is a continuation-in-part of U.S. Ser. No. 100,738, filed on Sept. 24, 1987 now abandoned.

TECHNICAL FIELD

This invention relates to a process for forming a high heat resistant oil-impregnatable insulating board from aromatic polyamide fibrids and polytetrafluoroethylene (PTFE) floc or pulp subtantially free of hydrogen containing carbonaceous matter, and to the resulting insulating board.

BACKGROUND

There is an increasing need for high heat resistant insulating materials. Poly(m-phenylene isophthalamide) (MPD-I) has proven to be well-suited due to its high heat resistance. However, in forming oil-impregnatable insulating board, the value of the dielectric constant is very important. Mineral oil is considered to have a favorable dielectric constant of about 2.2. The oil-impregnated board typically has a higher value, but provides the mechanical strength needed in the system. The difference in dielectric constants leads to an imbalance in the division of electrical stress between the liquid and solid phases. It would be desirable to redistribute the electrical stress into the board which is more suitable for handling the stress. The dielectric constant of the board should ideally be equal to that of the oil.

A March, 1982 Report of the U.S. Department of Energy, entitled "Advance Concepts for Transformers Pressboard Dielectric Constant and Mechanical Strength" details one study of the problem of the difference in dielectric constants between the board and the oil. The Report discloses Cellulose/MPD-I and Cellulose/PTFE combinations and shows a lowering of the dielectric constant of the board approaching that of oil.

The use of aromatic polyamides and specifically MPD-I in oil-impregnatable insulating boards having high heat resistance is disclosed in U.S. Pat. No. 4,595,457. However, MPD-I pressboard impregnated with mineral oil has a dielectric constant of about 3.4. It would be desirable to have a high heat resistant insulating board having a dielectric constant closer to that of oil.

SUMMARY OF THE INVENTION

A high heat resistant oil-impregnatable insulating board having a dielectric constant in mineral oil of less than 2.7 has now been discovered. The board has 35-60 wt. % aromatic polyamide fibrous materials, preferably MPD-I and 40-65 wt. % PTFE fibrous materials, substantially free of hydrogen-containing carbonaceous matter preferably bleached PTFE floc. The board is further characterized by an average dissipation factor in oil of less than 0.01 and an average break strength of at least 500 kN/m width. Preferably 0-20 wt. % are MPD-I floc and at least 35 wt. % are MPD-I fibrids.

The process for making the board comprises the steps of:

(a) forming a slurry by mixing 40-65 wt. % polytetrafluoroethylene floc with 35-60 wt. % aromatic polyamide fibrids with water;

(b) subjecting the slurry to a paper making process to form a wet web;

(c) removing water from the wet web to a level of 70-90% water;

(d) stacking a plurality of webs;

(e) subjecting the stacked webs to a pressure of 5-106 kg/cm$^2$ and a temperature of 125°-190° C.

Fibrous materials include floc, pulp and fibrids. The PTFE fibrous materials used in the process for making the board must be PTFE floc or pulp substantially free of hydrogen-containing carbonaceous matter. A preferred form is "bleached" PTFE. PTFE pulp and floc are normally sold in a form known as "natural" PTFE. Natural PTFE contains cellulose. At lower temperatures, the inclusion of cellulose, the most common material for insulating boards, is not a problem. However, in high heat resistant insulating boards, exposed to higher temperatures, the cellulose will decompose and a by-product is water. Water is a conductor which will create problems in a transformer and water will degrade oil.

"Bleached" PTFE is the name for PTFE with all or essentially all of the cellulose removed from the PTFE. Combining MPD-I fibrids, with or without MPD-I floc, and bleached PTFE floc or pulp provides a high heat resistant insulating board with a dielectric constant more closely approaching the dielectric constant for oil. The bleached PTFE is approximately twice the cost of the natural PTFE and bleached PTFE provides no significant advantages over natural PTFE where the insulating board will not be exposed to the higher temperatures seen by high heat resistance insulating boards.

The insulating board of the invention, in the presence of the oils used in transformers, is suitable for prolonged use at temperatures up to about 200° C., which is somewhat higher than mineral oil, is suitable. Specialty oils suitable for use at this temperature are available.

TEST METHODS

The break strength (tensile breaking strength) data reported in the Example were determined in accordance with the Standard Test Method described in ASTM Designation: D 828-60 (Reapproved 1971), with editorial changes in July, 1984.

Board samples were impregnated with oil in accordance with the procedure described by the International Electrochemical Commission, IEC Standard, Publication 641-2, First Edition (1979), "Specification for pressboard and presspaper for electrical purposes, Part 2: Methods of test", pages 29 and 31 (section 17), published by the Bureau Central de la Commission Electrotechnique Internationale, Geneva, Switzerland. The dielectric constant (permittivity) and dissipation factor of the oil-impregnated board were determined in accordance with the procedure described in ASTM Designation: D 150-81.

EXAMPLE

Fibrids of poly(m-phenylene isophthalamide) (MPD-I) having an inherent viscosity of 1.5 were prepared substantially as described by Gross in U.S. Pat. No. 3,756,908, column 5, lines 34-54, stopping short of the refining step.

A quantity of commercially available polytetrafluoroethylene (PTFE) floc, 0.63 cm (¼ in) in length and substantially white in color (sold as Bleached "Teflon" PTFE fiber by E. I. du Pont de Nemours and Company) was obtained. This PTFE floc was commercially prepared by spinning a dispersion of PTFE particles in a viscose rayon spinning solution, sintering the spun filaments at 370° C. (700° F.), drawing the filaments to 6.3 times the original length, heating skeins of the sintered fiber in an oven with temperatures increasing slowly to 261° C. (502° F.) over 6 hours and holding the skeins at that temperature for another 6 hours, and finally heating the skeins again for 90 hours at 310° C. (590° F.).

The equipment consisted of a wet 20 cm (8 inch) square handsheet mold (manufactured by Noble & Wood), filtered by a 39.4/cm (100/in) mesh stainless steel screen.

The sheet forming slurry was produced by mixing 52.69 gms of PTFE 0.64-cm (¼ in) floc (on a dry basis) with 52.69 gms of the MPD-I fibrids (also on a dry basis) with 2400 ml of water. This was dispersed in a mixing apparatus for use in dispersing pulps for making paper (British Standard Disintegrator) for 5 minutes, after which an additional 600 ml of water was added. The resulting slurry was shaken in a container until fully mixed. The slurry was divided into 10 containers with 300 ml in each and an eleventh which contained the residual (usually 100-200 ml). Each of the 11 containers of slurry was used to form one waterleaf which was removed from the stainless steel screens, sandwiched between multiple plies of blotting paper and then pressed with a rolling pin to remove excess moisture. The 11 plies were stacked and then platen pressed at 70 kg/cm² (1000 psi) and 140° C. (284° F.) for 90 minutes.

A series of samples produced by this method were approximately 98 mils thick with an average basis weight of 2165 g/sq. m (63.82 oz/sq.yd) and an average density of 0.87 g/cc. The boards were found to have an average break strength of 522.9 kN/m (2986 lbs/in) width. The dielectric constant at 1000 Hz averaged 2.58 (in oil at 25° C.) with an average dissipation factor of 0.00339 (in oil at 25° C.).

We claim:

1. A heat-resistant oil-impregnatable insulating board comprising 35-60 wt. % aromatic polyamide fibrous materials and 40-65 wt. % polytetrafluoroethylene fibrous materials substantially free of hydrogen-containing carbonaceous matter and characterized by an average break strength of at least 500 kN/m width, a dielectric constant of less than 2.7 and an average dissipation factor in oil of less than 0.01.

2. The product of claim 1 wherein the aromatic polyamide is poly(m-phenylene isophthalamide).

3. The product of claim 2 wherein at least 35% of the poly(m-phenylene isophthalamide) fibrous materials are fibrids.

4. The product of claim 2 wherein 0-20% of the poly(m-phenylene isophthalamide) fibrous materials are floc.

5. A process for making a heat-resistant oil-impregnatable insulating board characterized by an average break strength of at least 500 kN/m width, a dielectric constant of less than 2.7 and an average dissipation factor in oil of less than 0.01, comprising the steps of
   (a) forming a slurry by mixing 40-65 wt. % polytetrafluoroethylene fibrous materials substantially free of hydrogen-containing carbonaceous matter with 35-60 wt. % aromatic polyamide fibrous materials with water;
   (b) subjecting the slurry to a paper making process to form a wet web;
   (c) removing water from the wet web to a level at 70-90% water;
   (d) stacking a plurality of webs; and
   (e) subjecting the stacked webs to a pressure of 5-106 kg/cm² and a temperature of 125°-190° C.

6. The process of claim 5 wherein the aromatic polyamide is poly(m-phenylene isophthalamide).

7. The process of claim 6 wherein 0-20% of the poly(m-phenylene isophthalamide) fibrous materials are floc.

8. The process of claim 6 wherein at least 35% of the poly(m-phenylene isophthalamide) fibrous materials are fibrids.

* * * * *